United States Patent [19]
Nozaki et al.

[11] Patent Number: 5,639,674
[45] Date of Patent: Jun. 17, 1997

[54] SEMICONDUCTOR LIGHT-EMITTING ELEMENT AND METHOD FOR MANUFACTURING THEREFOR

[75] Inventors: Hideki Nozaki, Kawasaki; Kazumi Unno, Yokohama, both of Japan

[73] Assignee: Kabushiki Kaisha Toshiba, Kanagawa-ken, Japan

[21] Appl. No.: 544,635

[22] Filed: Oct. 18, 1995

Related U.S. Application Data

[62] Division of Ser. No. 456,609, Jun. 1, 1995, Pat. No. 5,488,235, and a continuation of Ser. No. 209,731, Mar. 14, 1994, abandoned.

[51] Int. Cl.$^6$ ............................................. H01L 33/00
[52] U.S. Cl. ............................................. 437/5; 437/127
[58] Field of Search ................. 437/127, 5, 23, 437/129, 133, 905; 372/45; 257/94, 86, 103

[56] References Cited

U.S. PATENT DOCUMENTS

| | | | |
|---|---|---|---|
| 4,368,098 | 1/1983 | Manasevit | 156/606 |
| 4,902,356 | 2/1990 | Noguchi et al. | 437/127 |
| 4,910,571 | 3/1990 | Kasahara et al. | 357/30 |
| 5,008,718 | 4/1991 | Fletcher et al. | 357/17 |
| 5,040,044 | 8/1991 | Noguchi et al. | 437/235 |
| 5,048,035 | 9/1991 | Sugawara et al. | 372/45 |
| 5,103,271 | 4/1992 | Izumiya et al. | 357/17 |
| 5,128,276 | 7/1992 | Ambrosius et al. | 437/127 |
| 5,153,889 | 10/1992 | Sugawara et al. | 372/45 |
| 5,264,389 | 11/1993 | Hamada et al. | 437/127 |
| 5,270,245 | 12/1993 | Gaw et al. | 437/127 |
| 5,322,573 | 6/1994 | Jain et al. | 437/5 |
| 5,376,580 | 12/1994 | Kish et al. | 437/127 |
| 5,496,767 | 3/1996 | Yoshida | 437/129 |

FOREIGN PATENT DOCUMENTS

| | | | |
|---|---|---|---|
| 61-102786 | 5/1986 | Japan . | |
| 62-130572 | 6/1987 | Japan . | |
| 63-299381 | 12/1988 | Japan . | |
| 63-314875 | 12/1988 | Japan . | |
| 2298083 | 12/1990 | Japan . | |
| 6-69540 | 3/1994 | Japan | 437/23 |
| 6-77530 | 3/1994 | Japan | 437/23 |

Primary Examiner—John Niebling
Assistant Examiner—S. Mulpuri
Attorney, Agent, or Firm—Finnegan, Henderson, Farabow, Garrett & Dunner, L.L.P.

[57] ABSTRACT

A semiconductor light-emitting element has a crystal layer formed from aluminum of a high mol ratio of 60% or greater on the light producing surface. In the semiconductor light-emitting element, a conductive crystal with aluminum of a mol ratio of 50% or less, or a conductive crystal containing no aluminum is formed on the high aluminum crystal layer.

2 Claims, 5 Drawing Sheets

SEMICONDUCTOR LIGHT-EMITTING ELEMENT AND METHOD FOR MANUFACTURING THEREFOR

This application is a division of application Ser. No. 08/456,609, filed Jun. 1, 1995, U.S. Pat. No. 5,488,235 entitled "SEMICONDUCTOR LIGHT-EMITTING ELEMENT AND METHOD FOR MANUFACTURING THEREFOR," which is a continuation of application Ser. No. 08/209,731, filed Mar. 14, 1994 now abandoned.

BACKGROUND OF THE INVENTION

1. Field of the Invention

The present invention relates to a semiconductor light-emitting element using a InGaAlP system mixed crystal with a high brightness as a light emitting Layer in a LED, and a method for fabricating this semiconductor light-emitting element, and, in particular, to a semiconductor light-emitting element with superior resistance to humidity and with a long life expectancy providing high output performance, and a method for fabricating this semiconductor light-emitting element.

2. Description of the Prior Art

In recent years an Light Emitting Diode (LED) has been developed with a light-emitting layer of an InGaAlP mixed crystal system, as a high brilliant LED. The use of a $Ga_{1-x}Al_xAs$ current spreading layer, as a current diffusion layer, with a high ratio of mixed Al crystals (hereinafter $X_{Al}$) on the light producing surface is a structural feature of this LED. (Hereinafter there will be cases where, for brevity, when the ratio of included Al is high, the term "high Al" will be used, and when this ratio is low, the term "low Al" will be used.)

FIG. 1 is a general sectional view of an orange colored light-emitting InGaAlP LED formed using conventional technology.

For example, with epitaxial growth of a yellow light-emitting InGaAlP LED used as an example, as illustrated in FIG. 1, an n-type $In_{0.5}(Ga_{0.3}Al_{0.7})_{0.5}P$-clad layer 2 with a film thickness of 1.0 μm fabricated by a metal organic chemical vapor deposition method (MOCVD method) is formed on an n-type GaAs substrate 1, and then, an n-type $In_{0.5}(Ga_{0.72}Al_{0.28})_{0.5}P$ active layer 3 with a film thickness of 0.5 μm, a P-type $In_{0.5}(Ga_{0.3}Al_{0.7})_{0.5}$ P-clad layer 4 with a film thickness of 1.0 μm, and a P-type $Ga_{0.2}Al_{0.8}As$ current spreading layer 5 with a film thickness of 10 μm are successively formed, respectively. Subsequently, an electrode 7 is formed on the P-type $Ga_{0.2}Al_{0.8}As$ current diffusing layer 5 and an electrode 8 is formed on the other side of the n-type GaAs substrate 1. Finally, an element is detached by means of a dicing process to obtain an LED pellet.

In this manner, a high Al mixed crystal ratio $X_{Al}$ of 0.8 is obtained for a pellet light producing surface of the GaAlAs layer 5.

However, this type of GaAlAs layer 5 with a high Al mixed crystal ratio has a tendency to oxidize very easily, and for this reason the light-emitting characteristics deteriorate. This causes an extreme reduction in the life expectancy of the element, and the same drawback is also found in an element sealed in plastic.

As a countermeasure, conventionally, a method for forming a natural oxidation film has been carried out using a chemical surface treatment as another chemical process (for example, wet etching using a mixed reagent of $NH_4OH$ and $H_2O_2$), but the natural oxidation film obtained by this method is highly irregular, and the close adherence characteristics are weak because the oxidized film is formed forcibly. Because this film lacks mechanical strength, variations are produced in the life expectancy.

In addition, because of the character of this chemical process, problems arise inasmuch as it is not possible to carry out the process for forming the above-mentioned layers 1, 2, 3, 4, and 5 continuously, and, for this reason, the manufacturing takes considerable time.

Also, because of the character of a protective film of $SiO_2$ or $SiN_x$, usually formed by manufacturing using a silicon element is not possible to carry out the process for forming the above-mentioned layers 1, 2, 3, 4, and 5 successively, therefore there is the problem that the cost of manufacturing is increased.

If the Al mixed crystal ratio $X_{Al}$ for the $Ga_{1-x}Al_xAs$ current diffusing layer 5 is reduced to 0.5 or less during the formation of the layer, the life expectancy of the element is improved, but, conversely, there is a large absorption ratio for the light-emitting wave lengths from red to green, therefore this is not practical.

As outlined above, with a conventional semiconductor light-emitting element and the method for fabricating this element, a GaAlAs layer with a high Al mixed crystal ratio which is used as a current diffusing layer is very easily oxidized, therefore the light-emitting characteristics deteriorate, causing an extreme reduction in the life expectancy of the element.

In order to solve this problem, the natural oxidation film obtained by this method is highly irregular, even when a method to form a natural oxidation film using a chemical process is utilized, and this film lacks mechanical strength. There is therefore the drawback that variations are produced in the life expectancy. In addition, this chemical surface process requires another process in addition to the formation of each layer of the semiconductor light-emitting element. There is therefore the problem that excessive time is required for fabricating.

SUMMARY OF THE INVENTION

Accordingly, an object of the present invention is, with due consideration to the drawbacks of such conventional semiconductor light emitting devices, to provide a semiconductor light-emitting element using an InGaAlP system mixed crystal as a light emitting layer with superior resistance to humidity and high output characteristics, and to provide a highly efficient method for fabricating this semiconductor light-emitting element.

A semiconductor light-emitting element in a preferred embodiment according to the present invention comprises:
 a crystal layer formed from aluminum of a high mol ratio of 60% or greater on the light producing surface,
 wherein a conductive crystal with aluminum of a mol ratio of 50% or less, or a conductive crystal containing no aluminum is formed on the high aluminum crystal layer.

In the semiconductor light-emitting element above $In_{0.5}(Ga_{1-x}Al_x)_{0.5}P$ (where $0 \leq x \leq 1$) is used as the crystal layer with aluminum of a mol ratio of 50% or less.

In the semiconductor light-emitting element above, $In_{0.5}(Ga_{1-x}Al_x)_{0.5}P$ (where $0 \leq x \leq 1$) is used as the crystal layer with aluminum of a mol ratio of 50% or less; and
 the film thickness of the crystal layer with aluminum of a mol ratio of 50% or less is 0.01 μm or greater In the semiconductor light-emitting element above, $In_{0.5}(Ga_{1-x}Al_x)_{0.5}P$ (where $0 \leq x \leq 1$) is used as the crystal layer with aluminum of a mol ratio of 50% or less; and in the case where the forbidden band width of the crystal layer with aluminum of a mol ratio of 50% or less is smaller than the forbidden band width of the light-emitting layer, the film thickness of the crystal layer $In_{0.5}(Ga_{1-x}Al_x)_{0.5}P$ with aluminum of a mol ratio of 50% or less is within the range of 0.01 μm to 2 μm.

In the semiconductor light-emitting element above, $Ga_{1-x}Al_xAs$ (where $0 \leq x \leq 0.5$) is used as the crystal layer with aluminum of a mol ratio of 50% or less.

In the semiconductor light-emitting element above, $Ga_{1-x}Al_xAs$ (where $0 \leq x \leq 0.5$) is used as the crystal layer with aluminum of a mol ratio of 50% or less; and the film thickness of the crystal layer with aluminum of a mol ratio of 50% or less is 0.01 μm or greater In the semiconductor light-emitting element above, $Ga_{1-x}Al_xAs$ (where $0 \leq x \leq 0.5$) is used as the crystal layer with aluminum of a mol ratio of 50% or less; and in the case where the forbidden band width of the crystal layer with aluminum of a mol ratio of 50% or less is smaller than the forbidden band width of the light-emitting layer, the film thickness of the crystal layer $Ga_{1-x}Al_xAs$ (where $0 \leq x \leq 0.5$) with aluminum of a mol ratio of 50% or less is within the range of 0.01 μm to 2 μm.

A process for manufacturing a semiconductor light-emitting element of another preferred embodiment according to the present invention comprises;

a step for forming a crystal layer formed from aluminum of a high mol ratio of 60% or greater on the light producing surface; and a step for forming a conductive crystal with aluminum of a mol ratio of 50% or less, or a conductive crystal including no aluminum, on the high aluminum crystal layer, subsequent to the foregoing step, wherein each of the above-mentioned crystal layers is formed using a gass phase growth method.

In the process for manufacturing a semiconductor light-emitting element above, a metal organic chemical vapor deposition (MOCVD) method or a molecular beam epitaxial growth (MBE) method is used as the gass phase growth method.

In the semiconductor light-emitting element above, the crystal layer formed from aluminum of a high mol ratio of 60% or greater is formed on a GaAs substrate.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Before describing preferred embodiments of the present invention we will explain the features and general concept of the semiconductor light-emitting element according to the present invention.

Figure 1:
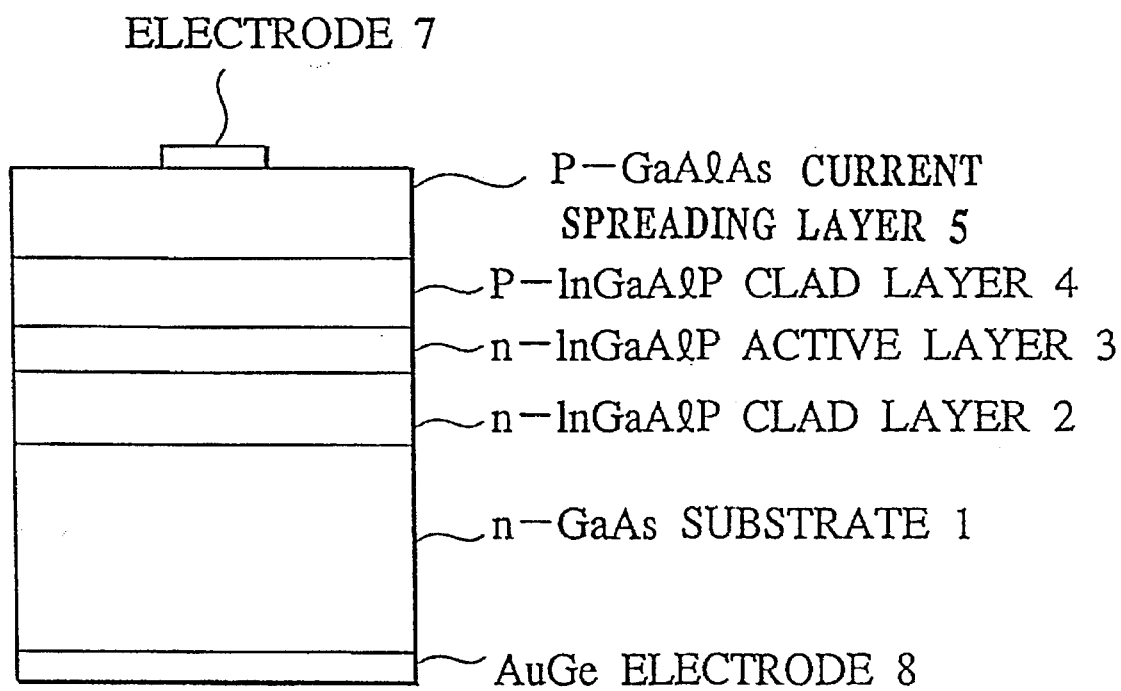
FIG. 1 is a general sectional view of a conventional orange colored light-emitting InGaAlP LED.
Figure 2:
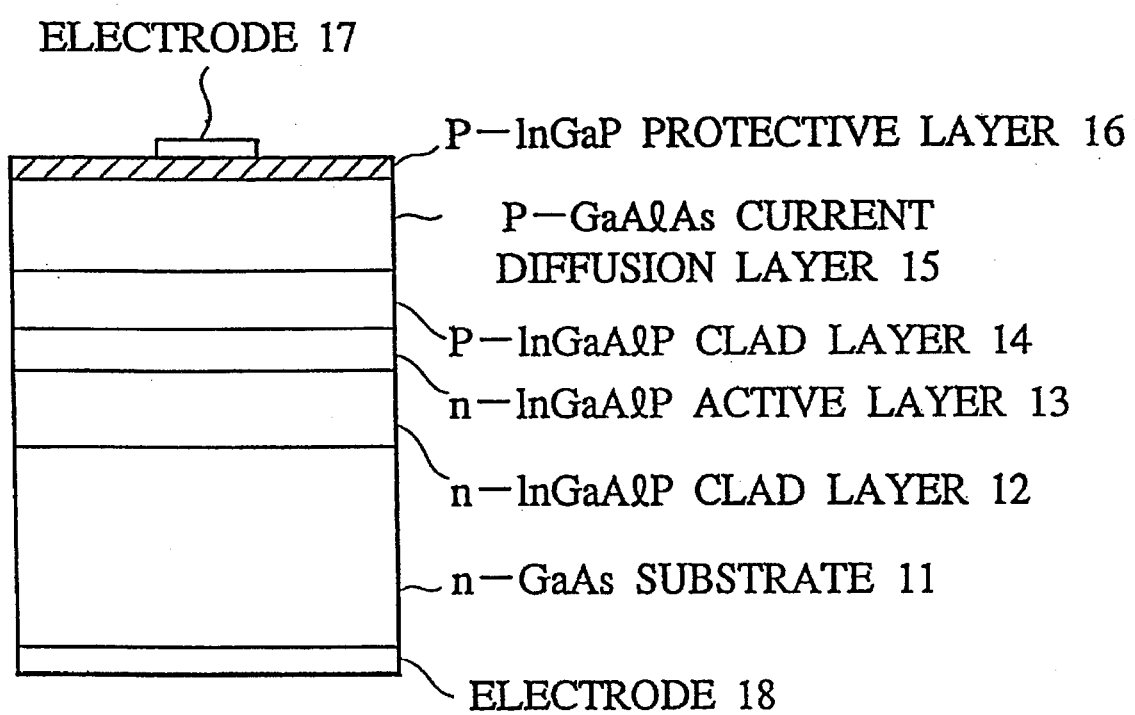
FIG. 2 is a general sectional view of an embodiment of a semiconductor light-emitting element of the present invention.

In the semiconductor light-emitting element of the present invention, and in the method for manufacturing this semi-conductor light-emitting element as illustrated in FIG. 2, a group III to V crystal layer with aluminum of a mol ratio of 50% or less or containing no aluminum, for example, a protective film layer 16 of $In_{0.5}(Ga_{1-x}Al_x)_{0.5}P$ (where $0 \leq x \leq 1$), $Ga_{1-y}Al_yAs$ (where $0 \leq y \leq 0.5$), InP, GaP, or GaAs or the like, is formed on a GaAlAs current diffusing layer 15 which is a light producing surface. This protective film 16 has the function of a humidity resistant protective film.

In addition, using a metal organic chemical vapor deposition (MOCVD) method or a molecular beam epitaxial growth (MBE) method which are processes for forming InGaAlP system mixed crystal layers 12, 13, 14, and 15, the mixed crystal layers 12, 13, 14, and 15 are formed successively, and the protective film 16 is formed as a thin-film with good efficiency.

Accordingly, the close adhesion characteristics of the GaAlAs current diffusing layer 15 and the group III to V crystal layer (protective film) 16 with aluminum of a mol ratio of 50% or less, or containing no aluminum, are strong.

In addition, although the protective film 16 with aluminum of a mol ratio of 50% or less, or containing no aluminum, is a thin film there are few defects, and a semiconductor light-emitting element can be provided which is mechanically strong so that the protective film does not peel away from the shock of the dicing process when forming the pellets, or from the shock of the wire bonding process in the manufacturing process. Because the protective film is conductive it is possible to form an ohmic electrode without the necessity of forming an opening in the protective film when it is required to form an ohmic electrode such as an $SiO_2$, $SiN_x$ protective film or a group III to V crystal protective film with low carrier density and high resistance, or when it is required to provide a wire bonding section.

Accordingly, by forming the protective film it is possible to avoid a complicated pellet forming operation, and it is possible to prevent the intrusion of $OH^-$ ions which have a bad influence on high Al crystals because of the ohmic electrode-protective layer boundary.

Furthermore, an oxidized film, which becomes a light absorbing layer on the light producing surface, is formed with extreme difficulty so that it is possible to provide a semiconductor light-emitting element with improved humidity resistance.

An embodiment of the present invention will now be explained with reference to the drawings.

FIG. 2 is a general sectional view of an embodiment of a semiconductor light-emitting element which emits yellow light (wave length approximately 590 nm) of the present invention.

First, an n-type $In_{0.5}(Ga_{0.3}Al_{0.7})_{0.5}P$-clad layer 12 (Si dopant, carrier density $5\times10^{17}$ cm$^{-3}$ thickness of 1.0 μm fabricated by the metal organic chemical vapor deposition method (MOCVD method) or by the molecular beam epitaxial growth method (MBE method) is formed on a (100) n-type GaAs substrate 11, followed by an n-type $In_{0.5}(Ga_{0.72}Al_{0.28})_{0.5}$ p active layer 13 (undoped, carrier density $1\times10^{17}$ cm$^{-3}$ or less) with a film thickness of 0.5 μm; a p-type $In_{0.5}(Ga_{0.3}Al_{0.7})_{0.5}$ p-clad layer 14 (Zn dopant, carrier density $5\times10^{17}$ cm$^{-3}$) with a film thickness of 1.0 μm; then a p-type $Ga_{0.2}Al_{0.8}As$ current diffusing layer 15 (Zn dopant, carrier density 1 to $2\times10^{18}$ cm$^{-3}$) with a film thickness of 10 μm; successively formed.

Next, following this, an $In_{0.5}(Ga_{1-x}Al_x)_{0.5}P$ (where $0 \leq x \leq 1$) protective film 16 (Zn dopant, carrier density $5\times10^{17}$ cm$^{-3}$) is formed with aluminum of a mol ratio of 50% or less, using the MOCVD method or the MBE method, to complete the formation of the crystals.

If the thickness of the $In_{0.5}(Ga_{1-x}Al_x)_{0.5}P$ (where $0 \leq x \leq 1$) protective film 16 is greater than 0.01 μm, it will function as a humidity resistant protective layer, but if the film becomes too thick it cannot be ignored as a light absorbing layer for light emission, therefore, the film thickness is set at about 0.01 to 2.0 μm.

Next, an AuZn (Zn 3 wt %, i.e., Zn is 3% by weight) surface electrode 17 with a film thickness of 1.0 μm is formed on the $In_{0.5}(Ga_{1-x}Al_x)_{0.5}P$ protective film 16, and an AuGe (Ge 3 wt %) surface electrode 8 with a film thickness of 1.0 μm is formed on the n-type GaAs substrate 1.

An element is then detached using the dicing process, to complete the process of forming a pellet of the semiconductor light-emitting element.

With the embodiment of this type, by forming the $In_{0.5}(Ga_{1-x}Al_x)_{0.5}P$ protective film 16 with aluminum of a mol ratio of 50% or less, or containing no aluminum, on the GaAlAs current diffusing layer 15 which becomes the light producing surface, using the metal organic chemical vapor deposition method which is the process for growing the InGaAlP system mixed crystal layers 12, 13, 14, and 15; and by successively forming each of the layers 12, 13, 14, and 15, these layers are thinly formed with good efficiency so that the GaAlAs current diffusing layer 15 and the $In_{0.5}(Ga_{1-x}Al_x)_{0.5}P$ protective film 16 have strong, close adherence.

In addition, the $In_{0.5}(Ga_{1-x}Al_x)_{0.5}P$ protective film 16 is thin with few defects, making it possible to provide a semiconductor light-emitting element which has the advantage of being mechanically strong. The formation of a $Ga_{1-y}Al_yAs$ (where $0 \leq y \leq 0.5$) protective film instead of the $In_{0.5}(Ga_{1-x}Al_x)_{0.5}P$ protective film 16 provides the same effect.

Figure 3:
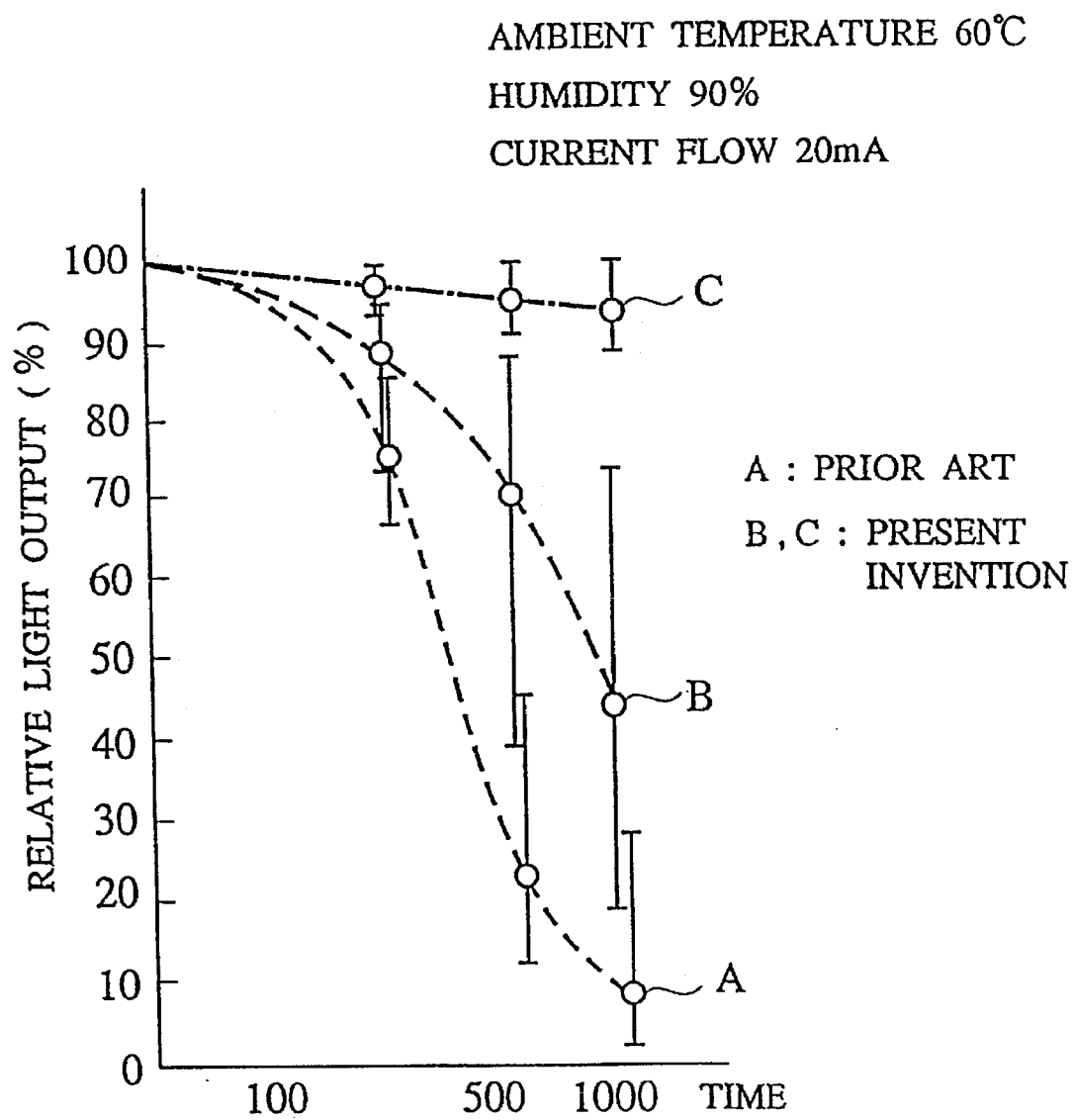
FIG. 3 is a graph showing the changes in the relative light output versus elapsed time for an LED lamp under conditions of high temperature and high humidity.

FIG. 3 is a graph showing the changes in the relative light output versus elapsed time for an LED lamp under conditions of high temperature and high humidity. The effectiveness of the semiconductor light-emitting element of this embodiment will be substantiated with reference to this drawing.

FIG. 3 shows the relationship between the relative light output (%) versus the time during which current is applied, in the case of 60° C. ambient temperature, 90% relative humidity, and 20 mA current flow (IF).

In the drawing, a dotted line A shows the case of a conventional semiconductor light-emitting element, specifically, an InGaAlP system LED with no special process used; the dashed line B shows the case of applying an oxidation film process, using a mixed reagent of $NH_4OH$ and $H_2O_2$ to an InGaAlP system LED in a conventional semiconductor light-emitting element; and the alternate short and long dash line C shows the case of a semiconductor light-emitting element InCaAlP system LED formed with the $In_{0.5}(Ga_{1-x}Al_x)_{0.5}P$ protective film 16 with a film thickness of 0.1 μm; for the embodiment shown in FIG. 2.

All these curves are made up of average lot values, therefore the ranges represented by the vertical lines show a large variation with respect to the time.

In the drawing, with the curve (A), where no special process has been used, a large deterioration occurs as time elapses. The curve (B), where the oxidation process has been used, shows an improvement over the curve (A), although a large variation is evident. In the curve (C) for the present embodiment it can be seen that there is almost no deterioration after 1000 hours, and, also, the variation is small.

Figure 4:
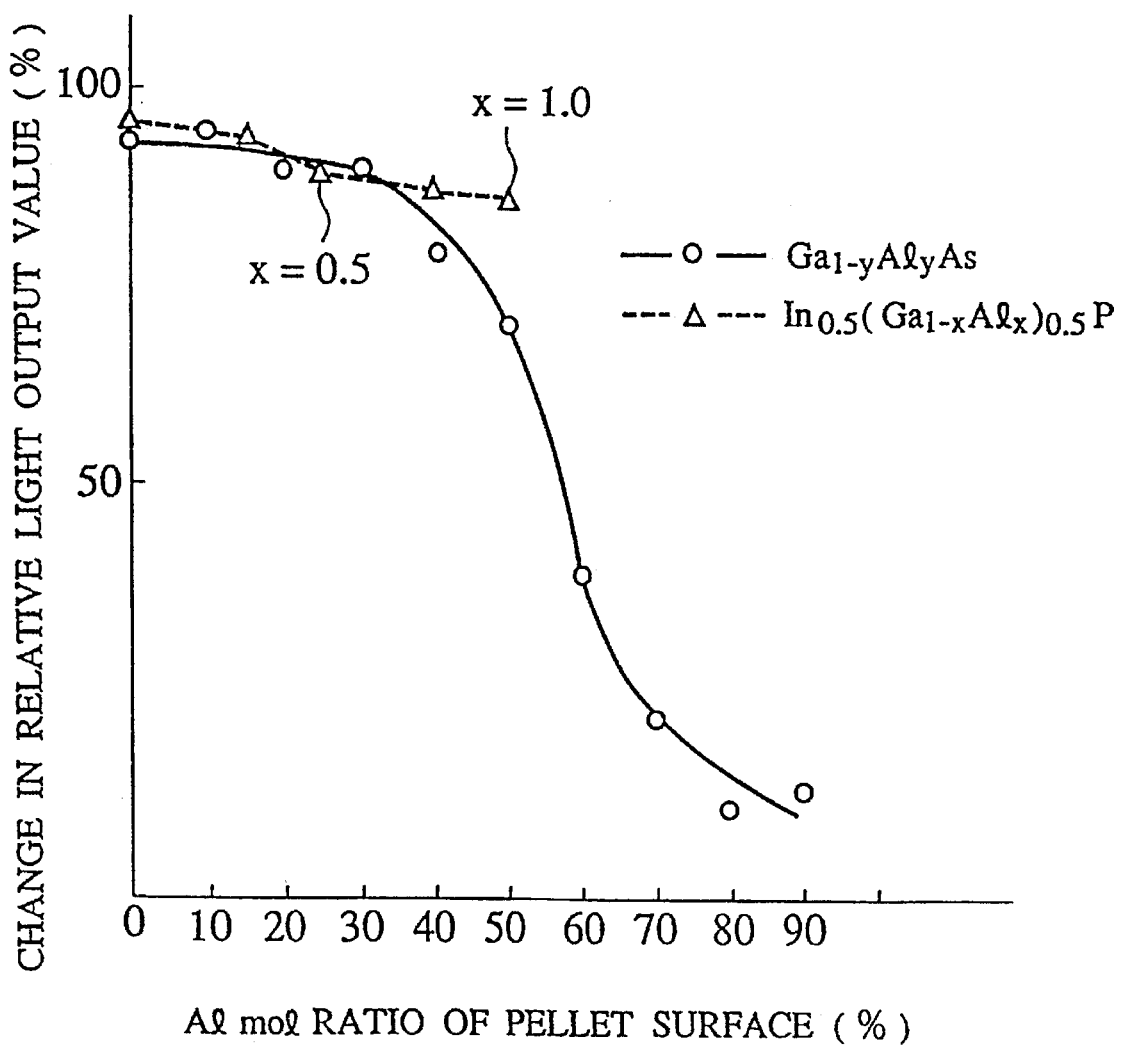
FIG. 4 is a graph showing the relationship between the Al mol % ratio of a protective film on the pellet surface and the changes in the relative light output values for the embodiment of a semiconductor light-emitting element shown in FIG. 2.

FIG. 4 is a graph showing the relationship between the Al mol ratio of a protective film on the pellet surface and the change in the relative light output values (life expectancy) for the semiconductor light-emitting element. The measured ambient conditions are 60° C. temperature, 90% relative humidity, and 20 mA current flow (IF), and the measurements were made after current had been passed through an LED lamp produced from the semiconductor light-emitting element of the present invention for 1000 hours.

The vertical axis represents the change in the relative light output values, and the horizontal axis represents the Al mol ratio of the pellet surface.

The solid line shows the case for $Ga_{1-y}Al_yAs$ and the dotted line shows the case of the $In_{0.5}(Ga_{1-x}Al_x)_{0.5}P$ protective film.

As can be seen from this graph, when the Al mol ratio of the protective film layer 16 is below 50%, the change in the relative light output values is maintained at 50% or greater, even after 1000 hours of electric current application.

Figure 5:
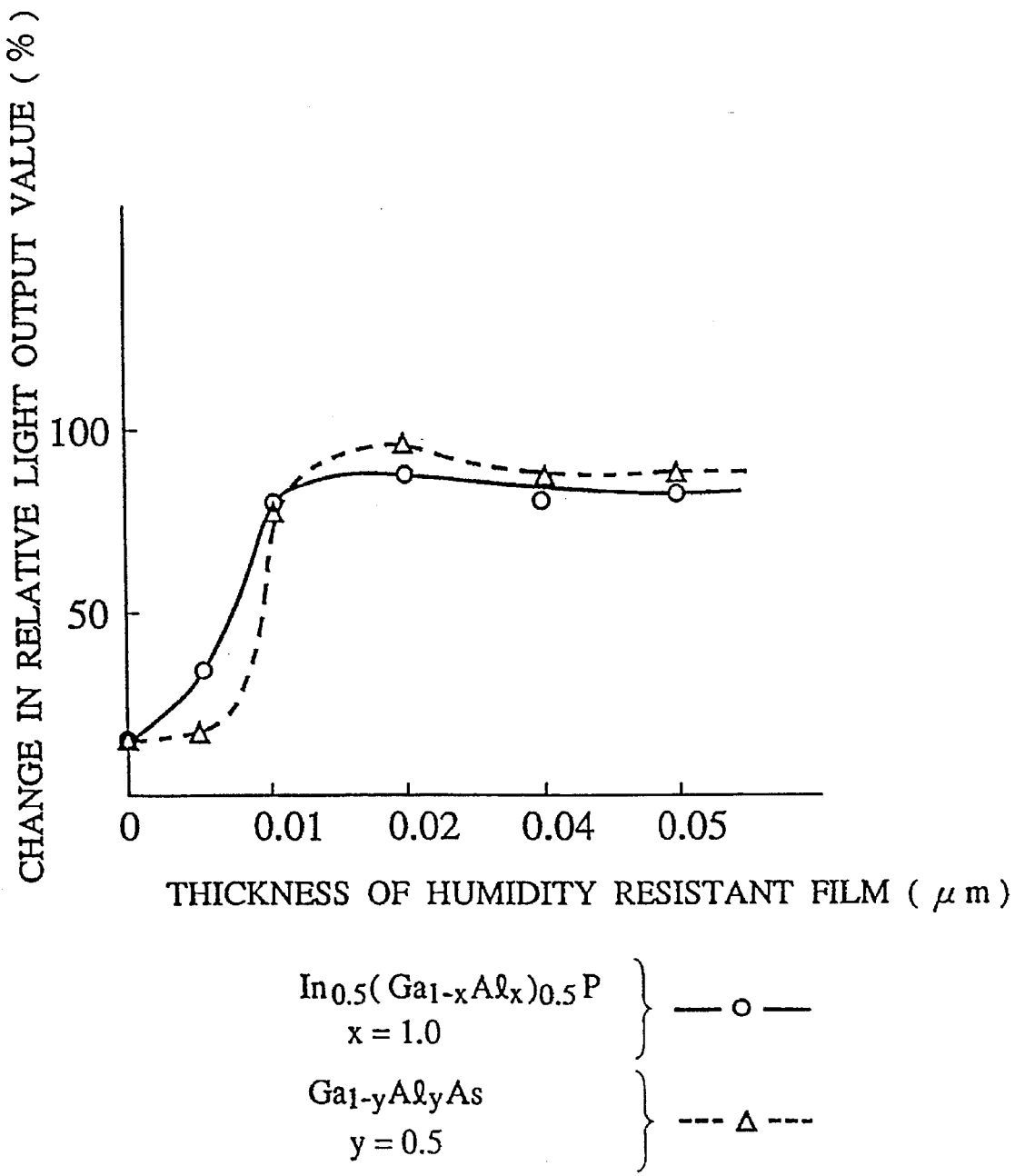
FIG. 5 is a graph showing the relationship between the film thickness of an $In_{0.5}(Ga_{1-x}Al_x)_{0.5}P$ protective film 16 and the change in the relative light output values (%) in the embodiment of a semiconductor light-emitting element shown in FIG. 2.

FIG. 5 is a graph showing the relationship between the film thickness of an $In_{0.5}(Ga_{1-x}Al_x)_{0.5}P$ protective film and the change in the relative light output values (%) for this embodiment of a semiconductor light-emitting element.

The measured ambient conditions are 60° C. temperature, 90% relative humidity, and 20 mA current flow (IF), and the measurements were made after current had been passed through an LED lamp produced from the semiconductor light-emitting element of the present invention for 1000 hours.

The vertical axis represents the change in the relative light output values (%), and the horizontal axis represents the thickness [μm] of the humidity resistant film.

The graph shows that when the thickness of the protective film layer 16 is 0.01 μm or greater, this film functions as a humidity resistant protective layer.

As outlined above, InGaAlP and GaAlAs are used as the protective film layer 16 in this embodiment. However, InP, GaAs, GaP, GaAlP, GaAsP can also be used as the protective film layer 16.

Also, the MOCVD method and the MBE method are used as the crystal forming methods for the light-emitting layer and the protective film layer, but, in addition to these, other methods such as an MOMBE method, a hydride VPE method, a chloride VPE method and the like can be used.

Table 1 gives an example of calculated values for the light transmittance ($P/P_0$) of a $Ga_{1-y}Al_yAs$ protective film (in the cases where y=0 and y=0.5) for a light-emission wave length [λp] of the semiconductor light-emitting element where thickness [μm] and absorption coefficient [α] are used as parameters.

Table 2 gives an example of calculated values for the light transmittance (P/P$_0$) of an In$_{0.5}$(Ga$_{1-x}$Al$_x$)$_{0.5}$P protective film (in the cases where x=0 and x=0.5) for a light-emission wave length [λp] of the semiconductor light-emitting element where thickness [µm] and absorption coefficient [α] are used as parameters.

In order to maintain the light transmittance at about 0.8 (about 80%), the thickness of the protective film differs in accordance with the value of the Al mixed crystal ratio X$_{Al}$.

In the 560 nm band this thickness is in the range of 0.02 to less than 0.05 µm. Also, in the 650 nm band, this thickness differs greatly in accordance with the value of the Al mixed crystal ratio X$_{Al}$, and when X$_{Al}$ is close to 0.7, at a thickness of 10 µm or more, almost none of the emitted light is absorbed but is nearly all is transmitted.

However, when it is necessary to have a protective film of greater thickness, the cost of forming the pellet is increased. The optimum value is about 2 µm or less.

As explained above, by means of this embodiment it is possible to provide an LED with superior humidity resistance by forming a group III to V crystal with aluminum of a mol ratio of 50% or less, or containing no aluminum. Further, this embodiment was explained using an In$_{0.5}$(Ga$_{1-x}$Al$_x$)$_{0.5}$P (where 0≦x≦1) protective film 16 as the humidity-resistant protective film 16, but it is also possible to provide an LED with the same characteristics using group III to V crystals such as a Ga$_{1-y}$Al$_y$As (where 0≦y≦0.5) crystal, or another GaAs crystal containing no Al, or InP, or the like.

In addition, the above-mentioned embodiment was explained with respect to a semiconductor light-emitting element with yellow emissions. However, the same effect can be obtained for an orange In$_{0.5}$(Ga$_{0.57}$Al$_{0.13}$)$_{0.5}$P, or a green In$_{0.5}$(Ga$_{0.6}$Al$_{0.4}$)$_{0.5}$P obtained by changing the Al component ratio of the active layer.

Also, with respect to the pellet structure, pellets provided with a light-reflecting layer formed by means of laminated layers of group III to V crystals between n-type clad layers, and n-type GaAs substrates; pellets using a current narrow blocking structure, or pellets combining both structures give the same characteristics.

Furthermore, the GaAs substrate has the same characteristics as a material with a surface direction offset from a surface with a surface direction [100], or a material using a surface with a surface direction or miller indices (111), and a surface direction(110).

The same effect is also obtained with a semiconductor light-emitting element formed in which each layer of the conductive type is the opposite of the conducting type in the case of the above-mentioned embodiment, that is, using the P-type rather than the n-type substrate as a GaAs substrate.

By means of the present invention as outlined above, a protective film layer from a group III to V crystal layer with aluminum of a mol ratio of 50% or less, or containing no aluminum, for example, In$_{0.5}$(Ga$_{1-x}$Al$_x$)$_{0.5}$P, Ga$_{1-y}$Al$_y$As (where 0≦y≦0.5), InP, or GaAs or the like, is formed on a crystal layer (GaAlAs current diffusing layer) containing Al, which is a light producing surface, with successive formation of an InGaAlP system mixed crystal layer using, for example, the metal organic chemical vapor deposition method which is a process for forming InGaAlP system mixed crystal layers, so that a thin-film formation is possible with good efficiency.

This protective film has the function of a humidity resistant protective film, and adheres closely with strong bonding to the group III to V crystal layer with aluminum of a mol ratio of 50% or less, or containing no aluminum. Although the film of the group III to V crystal layer with aluminum of a mol ratio of 50% or less, or containing no aluminum is thin, there are few defects, and a semiconductor light-emitting element can be provided which is mechanically strong so that the protective film does not peel away from the shock of the dicing process when forming the pellets, or from the shock of the wire bonding process in the fabricating process.

Because the protective film has conductive characteristics, it is possible to form an ohmic electrode without the necessity of forming an opening in the protective film, when it is required to form an ohmic electrode such as an SiO$_2$, SiN$_x$ protective film or a group III to V crystal protective film with low carrier density and high resistance, or when it is required to provide a wire bonding section.

Accordingly, by forming the protective film it is possible to avoid a complicated pellet forming operation, and it is possible to prevent the intrusion of OH$^-$ ions which have a bad influence on high Al crystals because of the ohmic electrode—protective layer boundary.

Accordingly, a highly efficient manufacturing method can be provided for a semiconductor light-emitting element. Furthermore, an oxidized film, which becomes a light absorbing layer is formed with extreme difficulty on the light producing surface, so that it is possible to provide a semiconductor light-emitting element with improved humidity resistance.

While the invention has been described with reference to the specific embodiments, the description is not meant to be construed in a limiting sense. Various modification of the disclosed embodiment, as well as other embodiments of the invention, will be apparent to persons skilled in the art upon reference to this description. It is therefore contemplated that the appended claims will cover any such modifications or embodiments as fall within the true scope of the invention.

TABLE 1

| PROTECTIVE FILM LAYER | α = 6.1 × 10$^4$ cm$^{-1}$ | 5.1 × 10$^4$ | 4.3 × 10$^4$ | 3.4 × 10$^4$ | 3.0 × 10$^4$ | 1.9 × 10$^4$ | 0.05 × 10$^4$ | 0.002 × 10$^4$ |
|---|---|---|---|---|---|---|---|---|
| LIGHT EMISSION | GaAs (Eg = 1.425 cv) | | | | Ga$_{0.5}$Al$_{0.5}$As (Eg = 1.975 ev) | | | |
| WAVELENGTH (λp) | 560 nm | 590 nm | 620 nm | 650 nm | 560 | 590 | 620 | 650 |
| t (µm) | (2.214 ev) | (2.102) | (2.000) | (1.908) | (2.214) | (2.102) | (2.000) | (1.908) |

TABLE 1-continued

| P/Po | | | | | | | | |
|---|---|---|---|---|---|---|---|---|
| 0.01 | 0.94 | 0.95 | 0.96 | 0.97 | 0.97 | 0.98 | 1.00 | 1.00 |
| 0.02 | 0.89 | 0.90 | 0.92 | 0.93 | 0.94 | 0.96 | 1.00 | 1.00 |
| 0.05 | 0.74 | 0.77 | 0.81 | 0.84 | 0.86 | 0.91 | 1.00 | 1.00 |
| 0.10 | 0.54 | 0.60 | 0.65 | 0.71 | 0.74 | 0.83 | 1.00 | 1.00 |
| 0.20 | 0.30 | 0.36 | 0.42 | 0.51 | 0.55 | 0.68 | 0.99 | 1.00 |
| 0.50 | 0.05 | 0.08 | 0.12 | 0.18 | 0.22 | 0.39 | 0.98 | 1.00 |
| 1.00 | 0.00 | 0.01 | 0.01 | 0.03 | 0.05 | 0.15 | 0.95 | 1.00 |
| 2.00 | 0.00 | 0.00 | 0.00 | 0.00 | 0.00 | 0.02 | 0.90 | 1.00 |
| 5.00 | 0.00 | 0.00 | 0.00 | 0.00 | 0.00 | 0.00 | 0.78 | 0.99 |
| 10.00 | 0.00 | 0.00 | 0.00 | 0.00 | 0.00 | 0.00 | 0.61 | 0.98 |

P/Po = exp (−αt)
P/Po: LIGHT TRANSMISSION VALUE
α: ABSORPTION COEFFICIENT
t: THICKNESS

TABLE 2

| PROTECTIVE FILM LAYER LIGHT EMISSION | $\alpha = 3.8 \times 10^4$ | $2.8 \times 10^4$ | $2.0 \times 10^4$ | $1.0 \times 10^4$ | $0.1 \times 10^4$ | $0.0 \times 10^4$ | $0.001 \times 10^4$ | 0 |
|---|---|---|---|---|---|---|---|---|
| WAVELENGTH ($\lambda p$) | $In_{0.5}Ga_{0.5}P$ (Eg = 1.872 ev) | | | | $In_{0.5}(Ga_{0.5}Al_{0.7})_{0.5}P$ (Eg = 2.237 cv) | | | |
| t (µm) | 560 nm | 590 nm | 620 nm | 650 nm | 560 | 590 | 620 | 650 |
| P/Po | | | | | | | | |
| 0.01 µm | 0.96 | 0.97 | 0.98 | 0.99 | 1.00 | 1.00 | 1.00 | 1.00 |
| 0.02 | 0.93 | 0.95 | 0.96 | 0.98 | 1.00 | 1.00 | 1.00 | 1.00 |
| 0.05 | 0.83 | 0.87 | 0.90 | 0.95 | 1.00 | 1.00 | 1.00 | 1.00 |
| 0.10 | 0.68 | 0.76 | 0.82 | 0.90 | 0.99 | 1.00 | 1.00 | 1.00 |
| 0.20 | 0.47 | 0.57 | 0.67 | 0.82 | 0.98 | 1.00 | 1.00 | 1.00 |
| 0.50 | 0.15 | 0.25 | 0.37 | 0.61 | 0.95 | 1.00 | 1.00 | 1.00 |
| 1.00 | 0.02 | 0.06 | 0.14 | 0.37 | 0.90 | 0.99 | 1.00 | 1.00 |
| 2.00 | 0.00 | 0.00 | 0.02 | 0.14 | 0.82 | 0.98 | 1.00 | 1.00 |
| 5.00 | 0.00 | 0.00 | 0.00 | 0.01 | 0.61 | 0.95 | 1.00 | 1.00 |
| 10.00 | 0.00 | 0.00 | 0.00 | 0.00 | 0.37 | 0.90 | 0.99 | 1.00 |

P/Po = exp (−αt)
P/Po: LIGHT TRANSMISSION VALUE
α: ABSORPTION COEFFICIENT
t: THICKNESS

What is claimed is:

1. A process for manufacturing a semiconductor light-emitting element having a first crystal layer of a high mol ratio of 60% aluminum or greater, and a second, protective layer of a mol ratio of 50% aluminum or less completely covering the first layer, said method comprising:

forming a first crystal layer of a high mol ratio of 60% aluminum or greater on a light producing surface;

forming a second, permanent, crystal protective layer of a mol ratio of 50% aluminum or less completely covering the first layer wherein the first and second layers are formed using a gas phase growth method.

2. The process of claim 1, wherein a metal organic chemical vapor deposition method or a molecular beam epitaxial growth method is used for forming the first and second layers.

* * * * *

UNITED STATES PATENT AND TRADEMARK OFFICE
CERTIFICATE OF CORRECTION

PATENT NO. : 5,639,674
DATED : June 17, 1997
INVENTOR(S) : Hideki NOZAKI et al.

It is certified that error appears in the above-indentified patent and that said Letters Patent is hereby corrected as shown below:

Title page, Item [30], should read --Foreign Application Priority Data

March 15, 1993 [JP] Japan.........5-053539
September 29, 1993 [JP] Japan......5-242914--

Signed and Sealed this

Twenty-third Day of December, 1997

Attest:

BRUCE LEHMAN

*Attesting Officer*  *Commissioner of Patents and Trademarks*